(12) United States Patent
Brewer

(10) Patent No.: US 6,946,322 B2
(45) Date of Patent: Sep. 20, 2005

(54) LARGE AREA PRINTING METHOD FOR INTEGRATING DEVICE AND CIRCUIT COMPONENTS

(75) Inventor: Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 27 days.

(21) Appl. No.: 10/627,949

(22) Filed: Jul. 25, 2003

(65) Prior Publication Data

US 2004/0142575 A1 Jul. 22, 2004

Related U.S. Application Data

(60) Provisional application No. 60/398,390, filed on Jul. 25, 2002.

(51) Int. Cl.[7] .............................................. H01L 21/44
(52) U.S. Cl. ...................... 438/109; 438/622; 257/777
(58) Field of Search ................................ 438/106–197, 438/464; 257/777; 29/831–834

(56) References Cited

U.S. PATENT DOCUMENTS

| | | | |
|---|---|---|---|
| 4,912,844 A | | 4/1990 | Parker .......................... 29/848 |
| 5,545,291 A | | 8/1996 | Smith et al. .............. 156/655.1 |
| 6,417,025 B1 | * | 7/2002 | Gengel ........................ 438/107 |
| 6,500,694 B1 | * | 12/2002 | Enquist ....................... 438/109 |
| 2003/0062123 A1 | | 4/2003 | Hunter et al. ............... 156/310 |
| 2003/0068519 A1 | | 4/2003 | Brewer et al. .............. 428/620 |
| 2003/0112576 A1 | | 6/2003 | Brewer et al. .............. 361/119 |
| 2003/0140317 A1 | | 7/2003 | Brewer et al. ................. 716/1 |

OTHER PUBLICATIONS

Böhringer, K. F., et al., "Modeling of Capillary Forces and Binding Sites for Fludic Self–Assembly," *MEMS 2001: The 14th IEEE International Conference on Micro Electro Mechanical Systems*, pp. 369–374 (2001).

Terfort, A., et al., "Self–Assembly of an Operating Electrical Circuit Based on Shape Complementarity and the Hydrophobic Effect," *Advanced Materials*, vol. 10, No. 6, pp. 470–473 (1998).

Terfort, A., et al., "Three–Dimensional Self–Assembly of Millimetre–Scale Components,"*Nature*, vol. 386, p. 162–164 (Mar. 13, 1997).

* cited by examiner

*Primary Examiner*—Dung A. Le
(74) *Attorney, Agent, or Firm*—Ladas & Parry LLP

(57) ABSTRACT

A method for fabricating arbitrarily configured arrays of devices or circuit modules onto a host circuit substrate by using an assembly technique that temporarily locates and aligns the devices or circuit modules in positions to be received by the host circuit substrate. The method generally comprises four distinct steps. The first step comprises fabricating the individual devices and circuit modules in a manner that facilitates capture of the individual devices and/or modules by an assembly template. The second step comprises patterning the assembly template to provide receptacles or patterned coatings that capture the devices and modules in the appropriate orientation. The third step comprises the population of the assembly template with the devices and circuit modules. The fourth step comprises delivery of the device and circuit modules to the host circuit substrate.

42 Claims, 10 Drawing Sheets

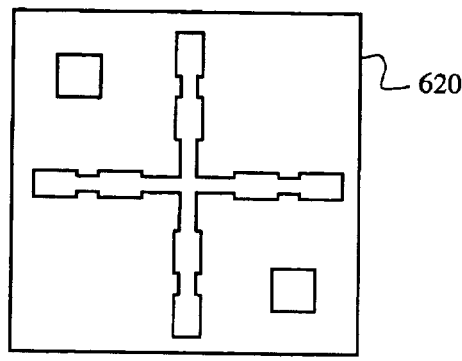
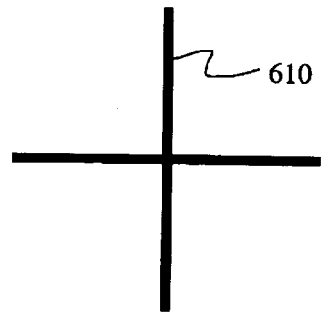
FIG. 8A  FIG. 8B
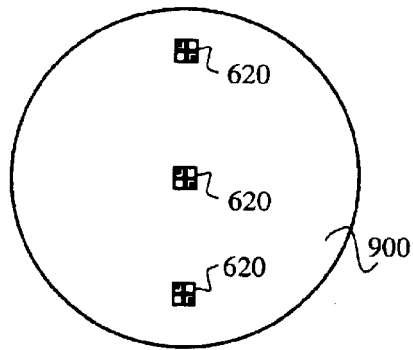
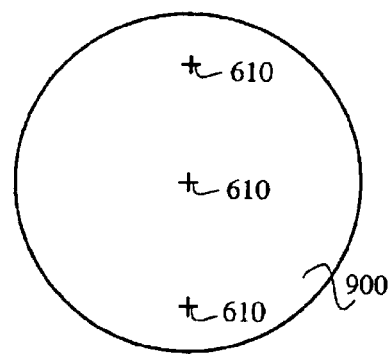
FIG. 9A  FIG. 9B

LARGE AREA PRINTING METHOD FOR INTEGRATING DEVICE AND CIRCUIT COMPONENTS

CROSS REFERENCE TO RELATED APPLICATIONS

This application claims benefit of U.S. Provisional Application No. 60/398,390 filed on Jul. 25, 2002, which is incorporated herein by reference in its entirety. This application is also related to the copending and commonly assigned patent application documents entitled "Oriented Self-Location of Microstructures with Alignment Structures," Provisional application No. 60/490,193 and "Self-Location Method and Apparatus," Provisional application No. 60/491,194 which are all filed of even date herewith. The contents of these related applications are hereby incorporated by reference herein.

FIELD

The present invention relates to fabricating integrated electronic systems and, more particularly, to a method for fabricating arbitrarily configured arrays of devices or circuit modules on host circuits or substrates.

BACKGROUND

Increasingly complex integrated electronic and optoelectronic systems require larger numbers of integrated circuits and devices to implement increasingly complex system functions. However, to achieve cost and weight goals, it is preferred that these integrated systems be implemented with as few separate device structures as possible. One approach is to fabricate all of the integrated circuits and devices on a single wafer or portion of a wafer, which provides the structural base for the system and minimizes the interconnect distances between circuits and devices. Such fabrication may be referred to as "wafer-scale" integration.

Many complex integrated electronic and optoelectronic systems require the use of integrated circuits and devices that utilize different semiconductor technologies. One approach known in the art for wafer-scale integration of different semiconductor technologies is heteroepitaxy. The heteroepitaxy approach may limit the number of different devices and material systems that can be successfully integrated. Moreover, growth and fabrication procedures optimized for a single device technology often must be compromised to accommodate dissimilar material systems. Finally, testing of individual portions of the integrated system may be made difficult by the fabrication techniques used to accommodate dissimilar material systems on a single wafer.

Since it may be difficult to fabricate high performance systems with multiple types of devices using heteroepitaxy approaches, it may be preferable to fabricate separate arrays of devices or circuit modules and couple these separately fabricated components to a host wafer. This approach allows each individual component to have state-of-the-art performance and high yield (due to pre-testing). Each component may use proven device and circuit architectures, while optimum epitaxial growth and/or device processing sequences are employed to fabricate each component.

The separate components may be individually integrated with the host wafer using any one of several established methods for chip-level integration. These methods generally rely upon surface-mounting techniques for attaching complete die assemblies using solder bumps or wire bonding. The most advanced of these methods is the "flip-chip" technique that can support integration of a wide variety of device technologies and fully utilizes the costly, high-performance device wafer real estate. However, flip-chip is generally limited to relatively large size components, typically greater than 1 square millimeter, and is inefficient for the placement of large numbers of components due to its serial nature.

At the wafer-scale level, self-assembly methods provide the best capability to allow integration of arbitrary configurations and densities of components. The most advanced of the self-assembly methods use a fluid medium to transport components to a host substrate or wafer for assembly. Two different fluidic self-assembly methods are known in the art, which differ in the underlying mechanism used to locate, position, and connect the components on the host substrate or wafer.

The first method of fluidic self-assembly uses gravitational forces and geometrical constraints to integrate components with a host substrate. The components are fabricated with specific shapes and complementary shaped receptacles are formed on the substrate for receiving the shaped components. The components are typically formed using semiconductor fabrication techniques and the receptacles are formed by using wet or dry etching techniques. A solvent such as water or ethanol is used to transport the individual components to the host substrate with the receptacles. The receptacles trap the components, which come to rest in predictable orientations due to their specific shapes. The driving potential is primarily gravitational in origin, but the fluid and surface forces may also play a role in the assembly process.

The second method of fluidic self-assembly utilizes chemically-based driving forces to govern the assembly process, where the attraction, positioning, orientation, and ordering of components is controlled by molecular interactions at the surfaces of the components and the host substrate. Molecular-based self-assembly techniques generally use surface coatings that consist of chemically-bonded films which are either hydrophobic or hydrophilic by nature. Thermodynamic driving forces control the assembly of complex arrays of components by minimizing the surface energies of the components and host substrate.

Both methods may be used together to provide for integration of electronic and opto-electronic devices into hybrid electronic systems. See, for example, A. Terfort, et al., "Self-Assembly of an Operating Electrical Circuit Based on Shape Complementarity and the Hydrophobic Effect," *Adv. Material*, 10, No. 6, 1998, pp. 470–473. See also A. Terfort, et al., "Three-dimensional Self-Assembly of Millimetre-scale Components," *Nature*, Vol. 386, Mar. 13, 1997, pp. 162–164.

However, fluidic self-assembly techniques known in the art have a number of significant limitations when used for the fabrication of complex, state-of-the-art, integrated electronic systems. Substantial processing of the host substrate or wafer is required to prepare the circuit for receiving the separate components provided by fluidic means. This processing may be extremely time consuming or costly or both. The required processing may also effect the types of host circuits that may be fabricated on the substrate or wafer, or the processing may increase the likelihood of damage of these circuits. Fabrication of receptacles in the host substrate or wafer may also reduce the real-estate available for either the host circuits or for the separate components provided by fluidic techniques. Also, the processing temperatures that may be used in fabrication are limited by the properties of the assembly fluid, further affecting the types of devices that may be used within the integrated system.

Therefore, there exists a need in the art for integrating device and circuit components utilizing different semiconductor technologies into wafer-scale integrated systems.

SUMMARY

Embodiments of the present invention provide methods for integrating device and circuit components utilizing different semiconductor technologies into wafer-scale integrated systems.

The printing method according to the present invention provides for transferring or "printing" arbitrarily configured arrays of semiconductor structures onto a host circuit substrate. This method allows virtually any device technology or material family to be monolithically integrated onto a host substrate. Individual semiconductor structures may be fabricated simultaneously using different processes and methods and may be assembled on the assembly template immediately after the structures are fabricated and separated. This parallel nature of semiconductor structure fabrication and assembly enables efficient assembly of the integrated system. The individual structures may also be tested and selected before being assembled on the assembly template, thus increasing the yield for the integrated systems and lowering the total cost for preparing those systems.

The printing method according to the present invention allows each individual structure or component integrated with the host circuits to have state-of-the-art performance and high yield (due to pre-testing), because the method is based on integrating separately fabricated components. Prior art approaches typically require device fabrication to take place after transfer or bonding of thin semiconductor layers, which can impose serious restrictions on the allowable device designs that can be employed. Preferred embodiments of the present invention allow for optimum epitaxial growth and/or device processing sequences to be employed for each component, which can use proven device and circuit architectures.

According to the present invention, arbitrarily configured arrays of devices or circuit modules may be printed onto a host circuit substrate by using an assembly technique that temporarily locates and aligns the devices or circuit modules in a position to be received by the host circuit substrate. The printing method generally comprises four distinct steps. The first step comprises fabricating the individual devices and circuit modules in a manner that facilitates capture of the individual devices and/or modules by an assembly template. The second step comprises patterning the assembly template to provide receptacles or patterned coatings that capture the devices and modules in the appropriate orientation. The third step comprises the population of the assembly template with the devices and circuit modules. The fourth step comprises delivery of the device and circuit modules to the host circuit substrate and the formation of robust mechanical and electrical contacts between the device and circuit modules and the underlying host circuits.

One embodiment of the present invention provides a method for fabricating an integrated electronic system comprising the steps of: providing a plurality of individual semiconductor structures fabricated for capture by an assembly template; forming the assembly template for capture of particular ones of the individual semiconductor structures; populating the assembly template with the particular ones of the individual semiconductor structures to form a populated assembly template with the particular ones of the individual semiconductor structures on the populated assembly template; and bonding at least one of the individual semiconductor structures on the populated assembly template to a host substrate comprising one or more host circuits. Any number of different semiconductor fabrication techniques may be used to fabricate the individual semiconductor structures. The assembly template may be fabricated to position and orient particular ones of the individual semiconductor structures based on geometry, on use of molecular forces, or other techniques.

Another embodiment according to the present invention is a method for fabricating an integrated electronic system comprising the steps of: providing a plurality of semiconductor structures of one or more types, each type of semiconductor structure being fabricated with a corresponding geometric shape; forming an assembly template, the assembly template having an array of receptacles, each receptacle having a shape complementary to the geometric shape of one type of semiconductor structure; positioning at least one semiconductor structure of the plurality of semiconductor structures in at least one receptacle of the assembly template, each semiconductor structure being positioned in a receptacle having a shape complementary to the geometric shape of the semiconductor structure; and bonding at least one of the semiconductor structures in a receptacle of the assembly template to a host substrate having one or more host circuits.

BRIEF DESCRIPTION OF THE DRAWINGS

FIGS. 8A and 8B show alignment marks that may be used in aligning wafers in accordance with the present invention.

FIGS. 9A and 9B show the wafers with the alignment marks depicted in FIGS. 8A and 8B.

DETAILED DESCRIPTION

Figure 1A:
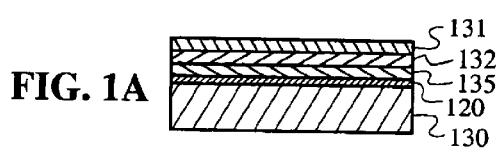
FIGS. 1A–1G illustrate the processing steps used to produce geometrically shaped device or integrated circuit components in accordance with an embodiment of the present invention.

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of layers and other elements shown in the accompanying drawings may be exaggerated to more clearly show details. The present invention should not be construed as being limited to the dimensional relations shown in the drawings, not should the individual elements shown in the drawings be construed to be limited to the dimensions shown.

According to the present invention, arbitrarily configured arrays of devices or circuit modules may be printed onto host circuits by using an assembly technique that temporarily locates and aligns the devices or circuit modules in a position to be received by the host circuits. The printing method generally comprises four distinct steps. The first step comprises fabricating the individual devices and circuit modules in a manner that facilitates capture of the individual devices and/or modules by an assembly template. The second step comprises patterning the assembly template to provide receptacles or patterned coatings that capture the devices and modules in the appropriate orientation. The third step comprises the population of the assembly template with the devices and circuit modules. The fourth step comprises delivery of the device and circuit modules to the host circuit substrate and the formation of robust mechanical and electrical contacts between the device and circuit modules and the underlying host circuits. These individual steps will now be described in more detail below.

FIGS. 1A–1G schematically illustrate the process steps that may be used to fabricate shaped device or integrated circuit components designed for capture by an assembly template. FIG. 1A illustrates the growth of a semiconductor structure with multiple epitaxial layers 131, 132, 135 on an appropriate substrate 130. Molecular Beam Epitaxy (MBE), Metal Organic Chemical Vapor Deposition (MOCVD), or other semiconductor fabrication techniques known in the art may be used to grow the multiple layers 131, 132, 135. The substrate 130 may comprise a substrate wafer made of materials preferably chosen to closely match the lattice parameters of the epitaxially grown layers 131, 132, 135. The materials for the substrate 130 may include GaAs, InP, SiC, $Al_2O_3$, Si, SiGe, GaSb, InSb, CdTe, CdZnTe and InAs. The multiple epitaxial layers 131, 132, 135 are typically thin, generally ranging from 1 micron to 10 microns thick, although some devices may have layers thinner or thicker than this range. Also, while FIG. 1A depicts three epitaxial layers 131, 132, 135, alternative embodiments may have more or less than three layers. The epitaxial layers generally comprise electrically active layers fabricated specifically for a particular device. FIG. 1A also depicts an optional etch stop layer 120 that may be deposited on the substrate 130 prior to the growth of the epitaxial layers 131, 132, 135.

Figure 1B:
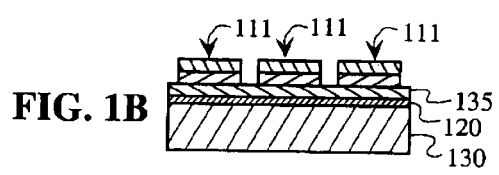

FIG. 1B illustrates the processing of the semiconductor structure comprising multiple epitaxial layers 131, 132, 135 to provide individually delineated semiconductor structures 111. The delineated semiconductor structures 111 may range in complexity and structure from individual devices, such as diodes, transistors, etc., to sub-device components, such as capacitors, inductors, etc., to integrated circuit modules. Hence, for purposes of this application, the terms "semiconductor structures," "individual semiconductor structures," or "delineated semiconductor structures" may be used to refer to sub-device components, individual devices, integrated circuit modules, or other components, devices, modules, or systems that may be created using semiconductor materials and/or fabrication techniques. The delineated semiconductor structures 111 may range in size from tens of square microns to square millimeters or larger. Conventional device or integrated circuit processing may be used to provide the delineated semiconductor structures 111, such as through the use of wet or dry etching. Electrical contacts (not shown) may also be provided in this step to provide electrical connections to the delineated semiconductor structures 111. Note that while FIG. 1C depicts the delineation of the semiconductor structures 111 down to the third layer 135, alternative embodiments of the semiconductor structures 111 may be provided by delineating down to and including the substrate 130.

Figure 1C:
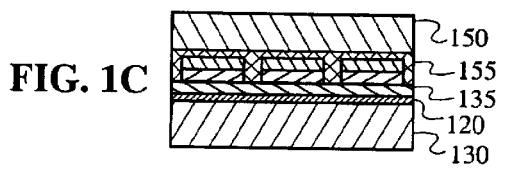

FIG. 1C illustrates the attachment of a handle wafer 150. A wax or epoxy filler layer 155 is applied over the delineated semiconductor structures 111. The wax or epoxy filler layer 155 is preferably made from materials that are easily dissolved, to facilitate the release of individual semiconductor structures 110, as discussed below. The handle wafer 150 is applied on top of the filler layer 155. The handle wafer 150 facilitates the additional processing used to release the individual semiconductor structures 110 (shown in FIGS. 1F and 1G).

Figure 1D:
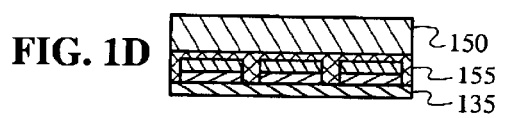

FIG. 1D illustrates the removal of the substrate 130 and the etch stop layer 120. Although FIG. 1D illustrates that all of the substrate 130 is removed, alternative embodiments may provide that only some of the substrate 130 is removed. Techniques known in the art may be used to remove these layers. Preferably, lapping or grinding is performed to remove the bulk of the substrate 130. Chemical-mechanical-polishing (CMP) may then be performed to remove an additional portion of the substrate 130. Selective etching may then be used to remove the remainder of the substrate 130 and the etch stop layer 120.

Figure 1E:
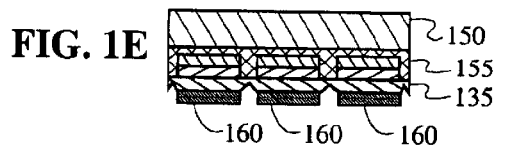

FIG. 1E illustrates the backside patterning and geometric shaping of the delineated semiconductor structures 111 to create the individual semiconductor structures 110. Mask areas 160 comprising photoresist may be applied to the bottom layer 135 of the delineated semiconductor structures 111. Known etching techniques may then be used to provide geometric patterning of the delineated semiconductor structures 111 to facilitate coupling of the resulting individual semiconductor structures 110 to an assembly template. Additional techniques for providing semiconductor structures having geometric patterning are discussed in U.S. Pat. No. 5,545,291, incorporated herein by reference.

Figure 1F:
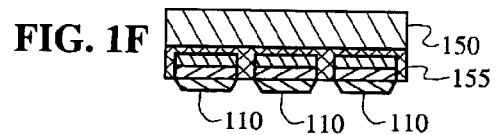
Figure 1G:
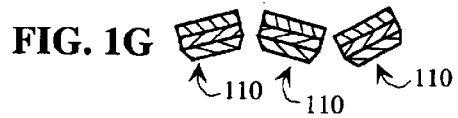

FIG. 1F illustrates the individual semiconductor structures 110 after having been geometrically patterned. Dissolving the wax or epoxy filler layer 155 with a solvent results in the release of the individual semiconductor structures 110, as shown in FIG. 1G. Preferably, the solvent is replaced with an appropriate assembly medium to facilitate the transfer of the individual semiconductor structures 110 to an assembly template, as discussed below.

Figure 2A:
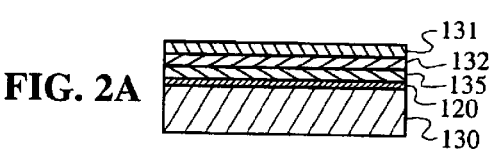
FIGS. 2A–2E illustrate the processing steps used to produce geometrically shaped device or integrated circuit components in accordance with another embodiment of the present invention.

FIGS. 2A–2E illustrate the process steps for an alternative method of fabricating geometrically patterned devices or integrated circuit components that are designed for capture by an assembly template. FIG. 2A illustrates the growth of a semiconductor structure with the multiple epitaxial layers 131, 132, 135 on the substrate 130 with the optional etch stop layer 120. The epitaxial layers 131, 132, 135 typically comprise electrically active layers fabricated specifically for a particular device. MBE, MOCVD, or other semiconductor fabrication techniques known in the art may be used to grow the multiple layer semiconductor structure. The substrate 130 preferably comprises a substrate wafer made of materials chosen to closely match the lattice parameters of the epitaxially grown layers 131, 132, 135. The materials for the substrate 130 may include GaAs, InP, SiC, $Al_2O_3$, Si, SiGe, GaSb, InSb, CdTe, CdZnTe, and InAs. The multiple epitaxial layers 131, 132, 135 are typically thin, generally ranging from 1 micron to 10 microns thick, although some devices may have layers thinner or thicker than this range. FIG. 2A depicts three epitaxial layers, but alternative embodiments may have more or less than three layers, depending upon the device to be fabricated.

Figure 2B:
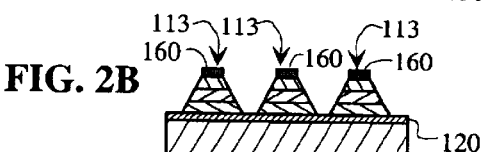

FIG. 2B illustrates the processing of the semiconductor structure depicted in FIG. 2A to provide individually delineated and geometrically-shaped semiconductor structures 113. The resulting geometrically-shaped semiconductor structures 113 may again range in complexity and structure from sub-device components (capacitors, inductors, etc.) to individual devices (diodes, transistors, etc.) to integrated circuit modules. The resulting geometrically-shaped semiconductor structures 113 may also range in size from tens of square microns to square millimeters or larger. FIG. 2B shows the front side patterning and geometric shaping of the semiconductor structures 113. Mask areas 160 comprising photoresist may be applied to the top layer 131 of the semiconductor layers to define the geometrically shaped semiconductor structures 113. Known etching techniques may then be used to provide geometric shaping of the perimeters of geometrically-shaped semiconductor structures 113 to facilitate coupling of the structures 113 to an assembly template. Additional techniques for providing semiconductor structures with geometric patterns or shapes are discussed in U.S. Pat. No. 5,545,291. Electrical contacts (not shown) and inter-device interconnects may also be provided in this step as well as other device or circuit fabrication steps known in the art, such as oxidation, passivation, isolation, metalization, etc. FIG. 2B shows the etching performed on the epitaxial layers 131, 132, 135, but alternative embodiments may also involve etching portions of the substrate 130.

Figure 2C:
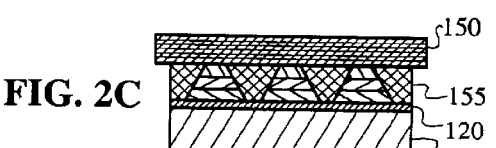

FIG. 2C illustrates the attachment of a handle wafer 150. A wax, dry resist, adhesive, spin-on-glass, or other temporary bonding material is applied as a filler layer 155 over the geometrically-shaped semiconductor structures 113. The filler layer 155 is preferably made from materials that are easily dissolved, to facilitate the release of the geometrically-shaped semiconductor structures 113 to provide individual semiconductor structures 110, as discussed below. The handle wafer 150 is applied on top of the filler layer 155. The handle wafer 150 facilitates the additional processing used to release the geometrically-shaped semiconductor structures 113. The handle wafer 150 may contain groove or via hole structures to allow penetration of a solvent or other material used to dissolve the temporary bonding material in the filler layer 155.

Figure 2D:
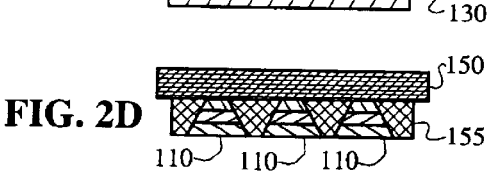

FIG. 2D illustrates the removal of some or all of the substrate 130 and the optional etch stop layer 120. Techniques known in the art may be used to remove these layers. Conventional lapping, grinding or chemical-mechanical-polishing may be performed to remove the bulk of the original substrate 130. Then, preferably, selective wet or dry etching is used to remove the substrate 130 and etch stop layer 120 to allow for the separation of the geometrically-shaped semiconductor structures 113 into the individual semiconductor structures 110.

Figure 2E:
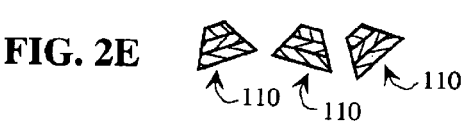

FIG. 2E illustrates the release of the individual semiconductor structures 110 after dissolving the temporary bonding material in the filler layer 155 by solvent exposure. Preferably, the solvent is replaced with an appropriate assembly medium to facilitate the transfer of the individual semiconductor structures 110 to an assembly template, as discussed below.

Another method for providing semiconductor structures with geometric patterns or shapes is illustrated in FIGS. 3A–3G. In this method, a stamped polymer structure is used to provide the geometric patterns that facilitates the transfer of individual semiconductor structures to an assembly template. Methods for applying and stamping a polymer layer are described in U.S. patent application Ser. No. 10/256,334, "Process for Producing High Performance Interconnects," filed Sep. 26, 2002; U.S. patent application Ser. No. 10/218,052, "Method for Assembly of Complementary-Shaped Receptacle Site and Device Microstructures," filed Aug. 12, 2002; and U.S. patent application Ser. No. 10/256,336, "Process for Assembling Three-Dimensional Systems on a Chip and Structure Thus Obtained," filed Sep. 26, 2002, all incorporated herein by reference. FIGS. 3A–3G present an exemplary method for using stamped polymer structures to provide semiconductor structures with geometric patterns or shapes, but other methods for using stamped polymer structures may also provide the desired semiconductor structures.

Figure 3A:
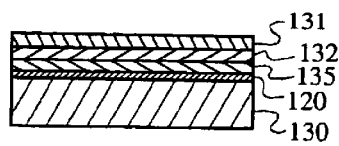
FIGS. 3A–3H illustrate the processing steps used to produce geometrically shaped device or integrated circuit components in accordance with still another embodiment of the present invention.
Figure 3E:
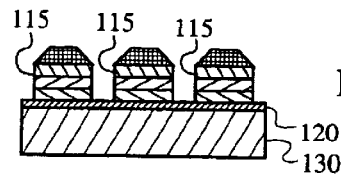
Figure 3B:
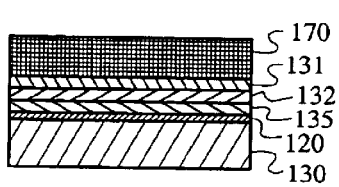

FIG. 3A again illustrates the growth of a semiconductor structure with multiple epitaxial layers 131, 132, 135 on an appropriate substrate 130 with an optional etch stop layer 120. FIG. 3B illustrates the application of a polymer layer 170. The polymer layer 170 may be applied to the multiple layer semiconductor structure using techniques known in the art, such as a spin-on process using a commercial photoresist spinner. The polymer layer 170 may comprise moldable materials known in the art, such as SU-8 photoepoxy, benzoclobutene, polyimide, or other such materials.

Figure 3F:
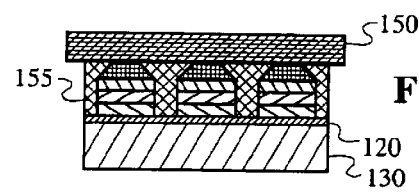
Figure 3C:
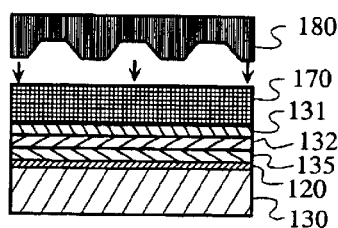
Figure 3G:
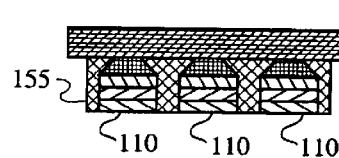
Figure 3D:
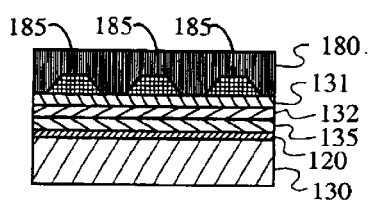

FIG. 3C shows the positioning of a shaping wafer 180 above the polymer layer 170. FIG. 3D shows the application of the shaping wafer into the polymer layer 170 to form geometric shapes 185 above the multiple epitaxial layers 131, 132, 135. The shaping wafer 180 typically comprises a semiconductor substrate on which semiconductor fabrication techniques may be used to form a stamp pattern to create the geometric shapes 185. As shown in FIG. 3C, the shaping wafer 180 is applied to the polymer layer 170 with sufficient pressure and at a suitable temperature so as to form the geometric shapes 185. The same procedures and techniques discussed below for forming an assembly template may also be use in stamping and molding the polymer layer 170.

After the geometric shapes 185 are formed in the polymer layer 170, the shaping wafer 180 is removed and additional processes are used to remove any residual polymer material outside of the geometric shapes 185 from the polymer layer 170. The geometric shapes 185 are then used as mask areas to support the delineation of the multiple epitaxial layers 131, 132, 135 into patterned and delineated semiconductor structures 115, as shown in FIG. 3E. Alternative embodiments may also etch the substrate 130. Known etching steps may be used to provide the patterned and delineated semiconductor structures 115. Electrical contacts and interdevice interconnects may also be fabricated during this step, as well as other device or circuit fabrication steps known in the art, such as oxidation, passivation, isolation, metalization, etc.

Figure 3H:
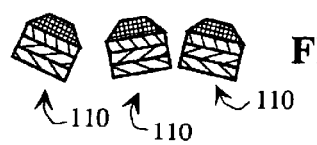

Steps similar to those previously described are used for the application of the handle wafer 150 and the separation of the patterned and delineated semiconductor structures 115 into individual semiconductor structures 110. FIG. 3F depicts the application of the filler layer 155 and the handle wafer 150. FIG. 3G depicts the removal of the substrate 130 and the optional etch stop layer 120. In alternative embodiments, only some of the substrate 130 may be removed. Finally, FIG. 3H depicts the release of the patterned and delineated semiconductor structures 115 to provide individual semiconductor structures 110. Note that, in the method depicted in FIGS. 3A–3H, the geometric pattern of the individual semiconductor structures 110 is provided by patterning polymer material that rests on top of the semiconductor material comprising the individual semiconductor structures 110, while the previous methods described patterning the semiconductor material itself.

Another method for forming semiconductor structures with geometrically-shaped assembly structures is shown in FIGS. 12A–12H. The method depicted is FIGS. 12A–12H is particularly adapted to form the key structures described in additional detail in copending and commonly assigned patent application "Oriented Self-Location of Microstructures with Alignment Structures," Ser. No. 60/490,193. In this method, a photolithographic process is used to fabricate an alignment key structure or assembly structure from a polymer layer on a semiconductor structure. The alignment key structure or assembly structure then facilitates the location and orientation of the semiconductor structure on an assembly template.

Figure 12A:
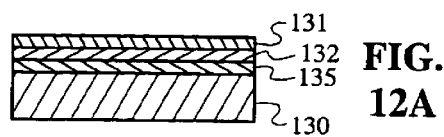
FIGS. 12A–12H illustrate the processing steps used to produce geometrically shaped device or integrated circuit components in accordance with still another embodiment of the present invention.

FIG. 12A illustrates the growth of a semiconductor structure with multiple epitaxial layers 131, 132, 135 on an appropriate substrate 130. As described above, semiconductor fabrication techniques well-known in the art may be used to grow or fabricate the layers. The substrate 130 may also comprise the substrate materials discussed above.

Figure 12B:
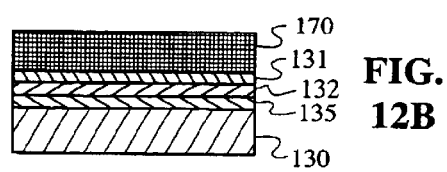

FIG. 12B illustrates the application of a polymer layer 170. The polymer layer 170 may be applied to the semiconductor structure using techniques well-known in the art, such as a spin-on process using a commercial photoresist spinner. The polymer layer 170 preferably comprises photoimagable material known in the art, such as SU-8, benzocyclobutene, polyimide, or thick photoresist materials or other such materials.

Figure 12C:
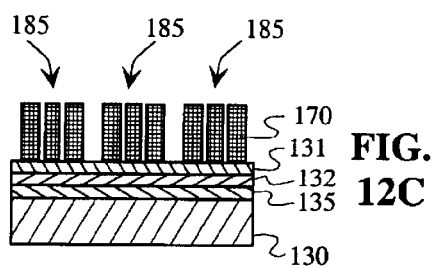

FIG. 12C illustrates the photolithographic patterning of the polymer layer top form the alignment key structures 185. Photolithographic patterning of polymer material is well known in the art. The patterned exposure of the polymer layer 170 to ultraviolet light (wavelength typically between 350 nm and 400 nm) is used to define the pattern of the alignment key structures 185. The polymer layer 170 may comprise polymer that is negative acting type material (exposed pattern regions remain after the development process) or positive acting type material (unexposed regions of the pattern remain after the development process). The shapes of the alignment key structures may include unique perimeter shapes and interior shapes to aid the capture and alignment of each alignment key structure (and its corresponding semiconductor structure) in the receptacles of the assembly template. The exposure process may be performed using a commercially available lithography system such as the EVG 620 Precision Alignment System from EV Group, Inc. of Schaerding, Austria. The use of this system is described in additional detail below. Such a system provides that the alignment key structures 185 are formed on the semiconductor structures with preferred micron level precision. Note that the patterning process is performed according to the manufacturer's recipe for a particular polymer material. For example, the normal process for SU-8 comprises the steps of: spin coat; soft bake; patterned exposure, post exposure bake; and develop.

The alignment key structure 185 according to the present invention may comprises more than one layer of polymer material. This would result in an alignment key structure with a more complex three-dimensional shape. For two layer alignment key structures, a two step process is used in which two layers of polymer material are successively applied and exposed with patterns to result in a two level alignment structure. In this process, the thickness of each of the polymer layers can be independently controlled to create the required key structure. The patterning of the upper and lower layers can be performed with micron-level alignment accuracy relative to one another and to the semiconductor structure itself using commercially available equipment.

Figure 12D:
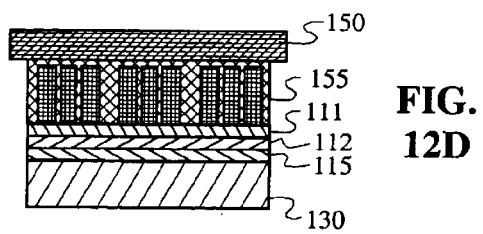

Steps similarly to those previously described are used for the application of the handle wafer, the full or partial removal of the substrate 130, backside metalization 129, and the separation of the individual semiconductor structures 110. FIG. 12D depicts the application of the filler layer 155 and the handle wafer 150. The filler layer 155 and the handle wafer 150 may comprise materials as previously described.

Figure 12E:
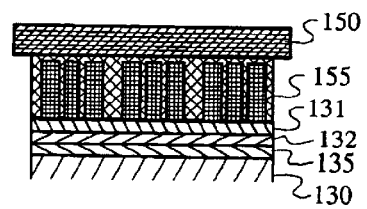

FIG. 12E depicts the partial removal of substrate material from the substrate 130. Conventional lapping, grinding or chemical-mechanical-polishing may be used to remove portions of the substrate materials. Again, some or all of the substrate material may be removed in this step.

Figure 12F:
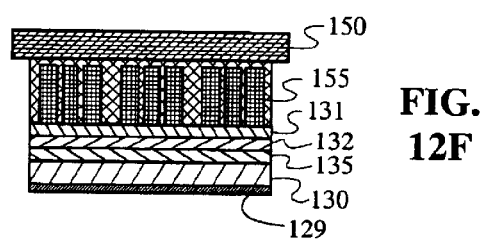

FIG. 12F depicts the deposition of a metal layer 129 to the backside of the substrate layer 130 (or, alternatively, one of the epitaxial layers 135 or an etch stop layer, if the entire substrate is removed). Metalization in this step may facilitate the formation of electrical connections during later steps of the assembly process. The metal layer 129 may comprise Ti, Pt, and/or Au, some combination thereof, or other metal or metal combinations known in the art.

Figure 12G:
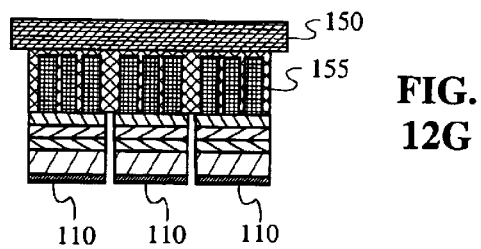

FIG. 12G depicts the delineation of the individual semiconductor structures 110. Conventional techniques, such as scribe and break, wet or dry etching, etc., may be used to perform the delineation of the substrate 130 and multiple epitaxial layers 131, 132, 135 into the individual semiconductor structures 110.

Figure 12H:
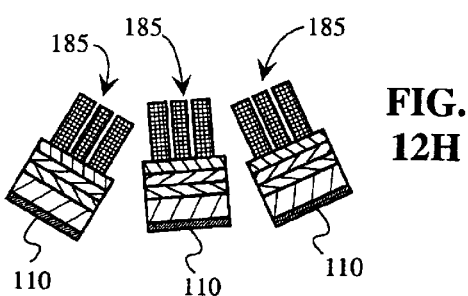

Finally, FIG. 12H depicts the release of the individual semiconductor structures 110 from the handle wafer 150. As described previously, a solvent may be used to dissolve the filler layer 155 to release the structures 110. The solvent may then be replaced with an appropriate assembly medium to facilitate the transport of the individual semiconductor structures to the assembly template.

The next major step in the printing method of the present invention comprises forming an assembly template for receiving the individual semiconductor structures. Of course, the steps for forming the assembly template may be performed before or after the creation of the individual semiconductor structures. The assembly template contains receptacles or patterned coatings that allow the individual semiconductor structures 110 to be disposed on the assembly template at specific locations and with specific orientations.

The assembly template may be formed by using semiconductor fabrication techniques well-known in the art to form shaped receptacle areas within a semiconductor substrate. Such techniques are described in U.S. Pat. No. 5,545,291. However, semiconductor fabrication techniques may limit the ability to form complex receptacle shapes in the semiconductor substrate, thus limiting the number of different shapes of individual semiconductor structures that may be positioned in the assembly template.

Other methods for forming the assembly template comprise patterning a flat surface with chemical coatings. In such methods, the assembly template and individual semiconductor structures are coated with hydrophobic and hydrophilic patches. The methods rely on molecular forces (i.e. surface tension) to control the adhesion of selectively coated semiconductor structures onto a patterned assembly template. A method using molecular forces is further described in pending U.S. patent application Ser. No. 10/218,053 entitled "Method of Self-Latching for Adhesion during Self-Assembly of Electronic or Optical Components," filed Aug. 12, 2002, incorporated herein by reference. Other such methods are described by Karl F. Bohringer et al., in "Modeling of Capillary Forces and Bind Sites for Fluidic Self-Assembly," *MEMS 2001: The 14th IEEE International Conference on Micro Electro Mechanical Systems,* 2001, pages 369–374. An advantage of such methods is that the formation of geometrically patterned semiconductor structures is not required to position the individual semiconductor structures at specific locations on the assembly template, thus simplifying the semiconductor fabrication techniques discussed above. However, tight control of the application of the hydrophobic and hydrophilic patches may be required for the precise location of specific types of semiconductor structures.

A preferred method for forming the assembly template comprises stamping polymer or SU-8 epoxy films to form shaped receptacles. As noted above, techniques for stamping polymer of SU-8 epoxy films are described in U.S. patent application Ser. No. 10/256,334, U.S. patent application Ser. No. 10/218,052, and U.S. patent application Ser. No. 10/256, 336. FIGS. 4A–4D schematically illustrate a preferred set of process steps to fabricate an assembly template 200 using stamping.

Figure 4A:
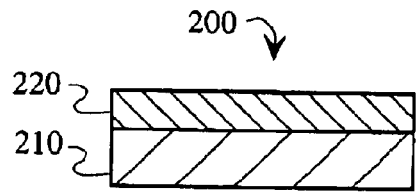
FIGS. 4A–4D illustrate the steps for the fabrication of an assembly template in accordance with an embodiment of the present invention.

FIG. 4A illustrates a first step where a polymer layer 220 is applied to an assembly substrate wafer 210. The assembly substrate wafer 210 may comprise typical semiconductor wafer materials, such as silicon or gallium arsenide. The polymer layer 220 may be applied to the substrate wafer 210 using techniques known in the art, such as a spin-on process using a commercial photoresist spinner. The polymer layer 220 preferably comprises dielectric materials known in the art, such as SU-8 photoepoxy, benzocyclobutene (BCB), or polyimide.

Figure 4B:
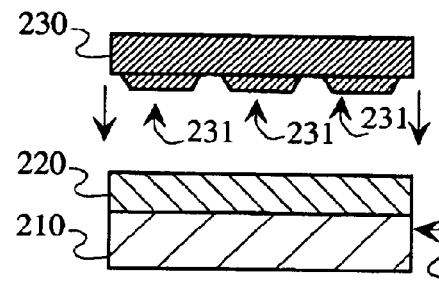

FIG. 4B depicts the provision of a stamp wafer 230 for stamping the polymer layer 220. The stamp wafer 230 contains a stamp pattern 231 that provides for complementary shaped receptacles 221 in the polymer layer 220. Along with the stamp pattern 231 for the shaped receptacles 221, frontside alignment markers (not shown in FIG. 4B) are also preferably formed on the stamp wafer 230 to facilitate alignment of the stamp wafer 230 with the assembly template 200. The stamp pattern 231 may be fabricated using semiconductor manufacturing techniques known in the art, such as photolithographic patterning of the stamp wafer 230 followed by wet-chemical etching or plasma etching techniques. A wide variety of sidewall shapes and angles may be obtained by employing different etching techniques and/or by selecting different crystallographic orientations and masking procedures on the stamp wafer 230.

Preferably, alignment marks are formed on both the stamp wafer 230 and the assembly substrate wafer 210. The alignment marks on the assembly substrate wafer 210 are preferably fabricated on its backside before the polymer layer 220 is stamped. The alignment marks are typically some shallow etched feature or metal pattern. One set of alignment marks used in the art comprise a crosshair on one wafer and an open cross on the other wafer. FIG. 8A shows a crosshair alignment mark 610 (typically having a width of 2 microns) and FIG. 8B shows an open cross alignment mark 620. Generally, the wafers have three alignment marks that are disposed along the center diagonal of the wafers. FIGS. 9A and 9B show wafers 700 with alignment marks 610, 620 along the center diagonal.

Figure 10A:
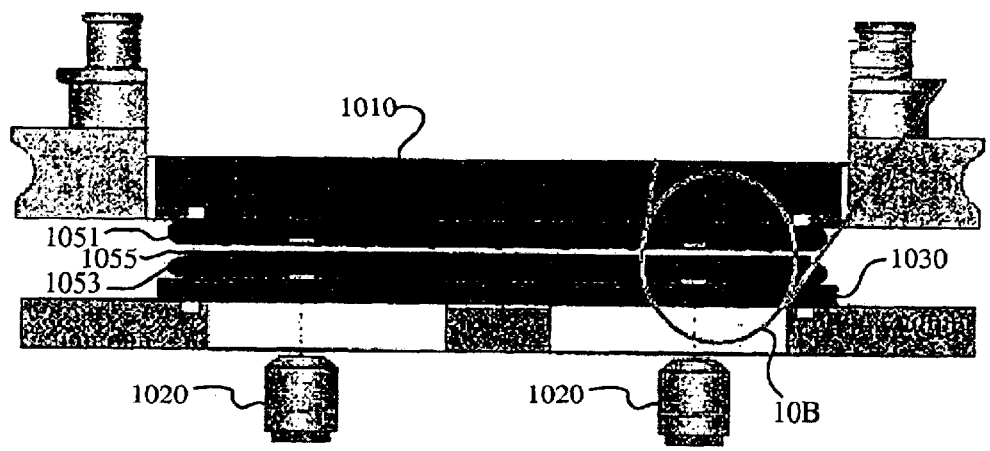
FIG. 10A shows a cross-sectional view of a typical system used for wafer alignment.
Figure 10B:
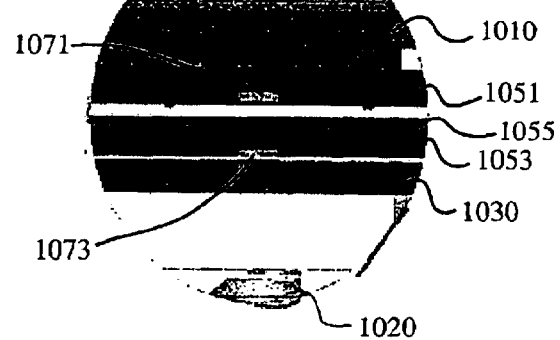
FIG. 10B shows an enlarged section of the system shown in FIG. 10A.

Using a crosshair alignment mark 610 and an open cross alignment mark 620 allows one to look through one of the features to align to the other. Since most wafers are opaque, a video camera is typically used to capture the image of the alignment marks on the front side of a first wafer. The image is then used to align the first wafer to the backside alignment marks on a second wafer. FIGS. 10A and 10B depict a typical system used for aligning wafers, the EV 620 wafer alignment system from EV Group, Inc. of Schaerding, Austria.

The EV 620 system allows a stamp wafer and a substrate wafer with a polymer layer to be aligned and mechanically clamped together. As shown in FIG. 10A, the system comprises two microscope objectives 1020 used to view alignment marks on a stamp wafer 1051 and a substrate wafer 1053, a fixed bond tool 1010 used to vacuum clamp the downward facing stamp wafer 1051, and a mechanically-adjustable glass 1030 used to vacuum clamp the substrate wafer 1053. FIG. 10A also depicts a polymer layer 1055 on top of the substrate wafer 1053. The two microscope objectives 1020 are used to view the front side of the stamp wafer 1051 and the backside of the substrate wafer 1053 during the alignment process. The enlarged portions of the wafers 1051, 1053 shown in FIG. 10B also shows the alignment mark 1071 on the front side of the stamp wafer 1051 and the alignment mark 1073 on the back side of the substrate wafer 1053.

The sequence of steps used to align the two wafers 1051, 1053 using an EV 620 system to prepare for stamping is as follows. First, the stamp wafer 1051 is loaded and fixed on the bond tool 1010. Next, the image of the alignment marks 1071 on the front side of the stamp wafer 1051 is stored by software. The substrate wafer 1053 is then loaded onto the bond glass 1010. The surface of the substrate wafer 1053 is then manipulated to be parallel to the surface of the stamp wafer 1051 at a separation of approximately 30 microns. The view of the alignment marks 1073 on the substrate wafer 1053 is then translated to overlap the stored image of the alignment marks 1071 on the front side of the stamp wafer 1051. The bond glass/substrate wafer combination is moved so that the viewed images of the alignment marks 1071, 1073 properly overlap. The stamp wafer 1051 and the substrate wafer 1053 are brought into contact and the wafers 1051, 1053 are mechanically clamped together so that a stamp pattern is applied to the polymer layer 1055. The clamped combination is then transferred to a embossing system, such as the EV 520 hot embossing system from EV Group, Inc., for imprinting the polymer layer 1055. Note that the process described above is an exemplary method for aligning a stamp wafer to a substrate wafer. Other processes known in the art may also be used to provide for proper alignment of the wafers.

Returning to FIG. 4C, after the stamp wafer 230 with the stamp pattern 231 is prepared, the step of the application of the stamp wafer 230 to the polymer layer 220 on the assembly substrate wafer 210 is performed. As discussed above, the stamp wafer 230 and the assembly substrate wafer 210 are preferably registered to one another using a commercially available alignment tool with front-to-back alignment capability, such as the EV 620 wafer alignment system described above. The wafers 210, 230 are preferably fixed in position to one another using a bonding tool, such as one used with the EV501 wafer bonding machine from EV Group, Inc. of Schaerding, Austria.

Figure 4C:
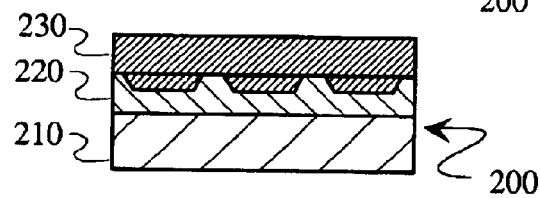
Figure 11A:
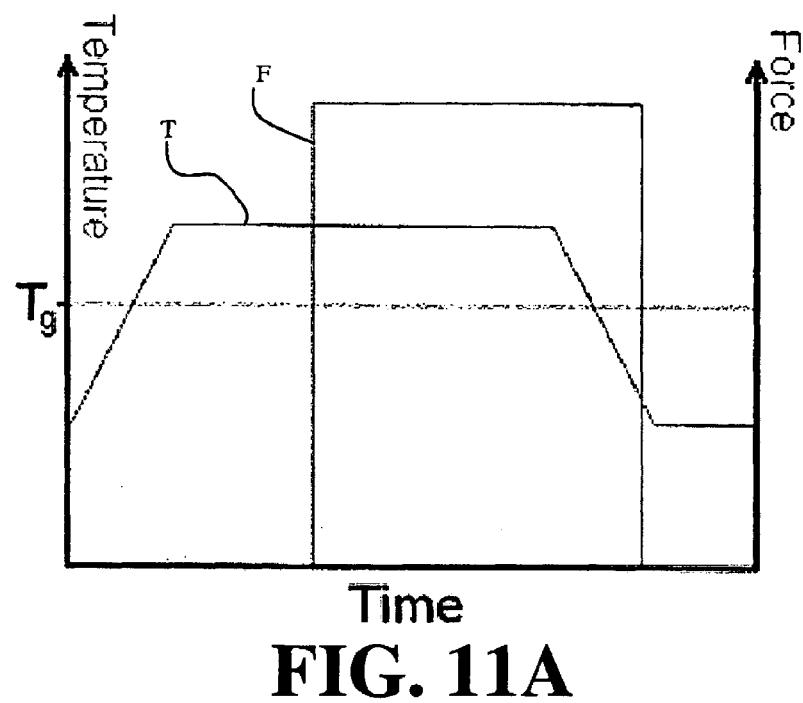
FIG. 11A shows a temperature T and force F diagram of an embossing process, which may be used in accordance with the present invention.
Figure 11B:
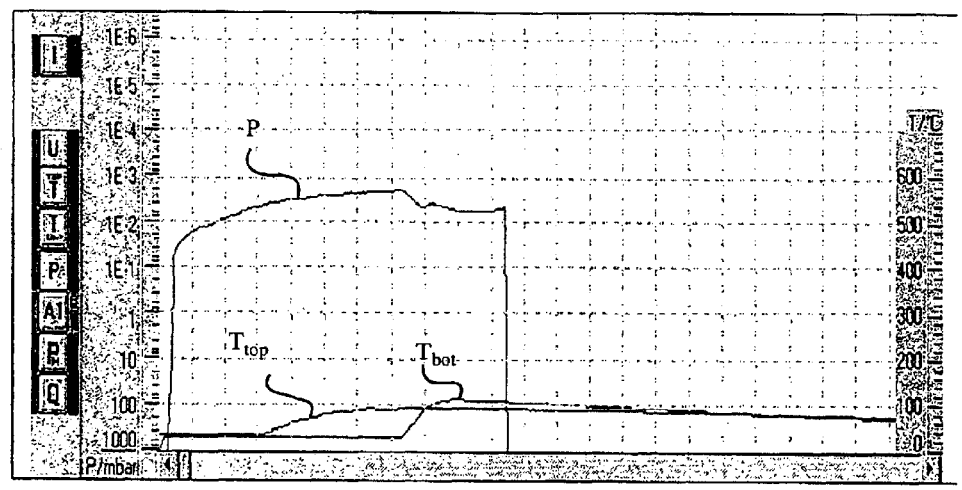
FIG. 11B shows measured temperature and pressure parameters during an embossing process, which may be used in accordance with the present invention.

A hot embossing machine, such as the EV520HE hot embossing machine from EV Group, may be used to mold (i.e., imprint) the polymer layer 220 with the stamp pattern 231 on the stamp wafer 230 shown in FIG. 4C. After the alignment process discussed above is performed, the bond tool including the bond glass, assembly substrate wafer 210 and stamp wafer 230 are transferred to an EV520HE hot-embossing system for embossing the polymer layer 220. The embossing process is typically performed under high vacuum conditions with precise temperature and stamping pressure control. The polymer layer 220 may be embossed at low pressures, typically less than 6.9 atmospheres (100 psi) and at a relatively low temperature, typically less than 100° C. However, to emboss, three steps should be performed: 1) heating the stamp wafer 230 and the assembly substrate wafer 210 above the glass transition temperature of the polymer layer 220 (for a polymer layer of SU-8 epoxy, the glass transition temperature is approximately 75° C.); 2) applying force to the stamp wafer 230 against the assembly substrate wafer 210 (approximately 3000 newtons for a 3" wafer); and, 3) cooling the polymer layer 220 down below the glass transition temperature. FIG. 11A shows a typical temperature T and force F diagram of the embossing process, where $T_g$ is the glass transition temperature. FIG. 11B shows the measured temperature and pressure parameters during a typical embossing process. In FIG. 11B, temperature of the top chuck $T_{top}$ and the bottom chuck $T_{bot}$ that are carrying the bond tool are shown along with the vacuum pressure P. The maximum embossing force and vacuum of the process generating the parameters shown in FIG. 11B are 3 KN and $5 \times 10^{-3}$ mbar, respectively.

Other methods for stamping recesses in deformable layers are known in the art, for example, such as those described in U.S. Pat. No. 4,912,844, which is incorporated herein by reference, and may be used in accordance with the present invention.

Figure 4D:
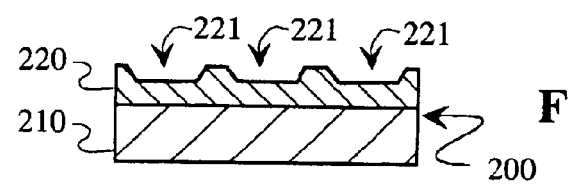

After the polymer layer 220 is molded with the stamp pattern 231, the stamp wafer 230 and the assembly substrate wafer 210 with the now-stamped polymer layer 220 are separated. If curing of the polymer layer 220 is required, the assembly substrate wafer 210 and polymer layer 220 combination may be baked at a temperature required to harden the layer 220 or the layer 220 may be exposed to ultraviolet light if photo-curing is needed. Alternatively, the polymer layer 220 may be left to cool and will harden as it cools. FIG. 4D shows the polymer layer 220 on top of the assembly template wafer 210 with the complementary-shaped receptacles 221. The combination of the shaped polymer layer 220 with the assembly substrate wafer 210 provides an assembly template 200, which is used in additional steps of the preferred embodiment of the present invention, as described below.

Another method for forming an assembly template comprises forming recesses in a silicon wafer. An embodiment of this method is depicted in FIGS. 13A–13E. Preferably, a two-step, deep reactive ion etch (DRIE) process is used to create three-dimensionally shaped receptacles in a silicon wafer surface. The DRIE process is well known in the art. The receptacles each preferably consist of a primary cavity shape having a circular base and secondary alignment structures comprising rectangularly shaped bars.

Figure 13A:
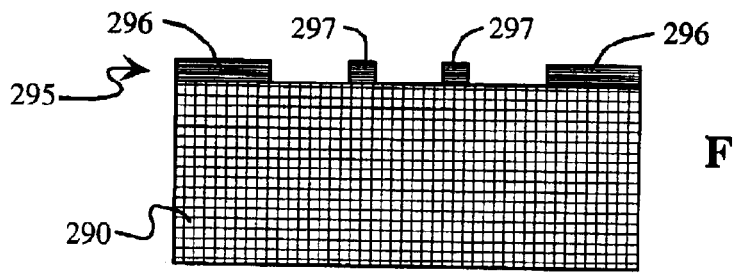
FIGS. 13A–13E illustrate the steps for the fabrication of an assembly template in accordance with another embodiment of the present invention.

FIG. 13A shows the application of a masking layer 295 to the silicon wafer 290 for producing the primary cavity 293 and the secondary alignment key structures 294 of a receptacle. The primary cavity 293 and the secondary alignment key structures 294 are shown in FIG. 13E, in which it can be seen that the secondary alignment structures 294 are located at the bottom of the primary cavity 293. The masking layer 295 comprises photoresist that defines the regions for removing the silicon surface material, preferably using a DRIE process. Specifically, the masking layer comprises an outside portion 296 that defines the outer perimeter of the primary cavity 293 and inner portions 297 that define the perimeters of the secondary alignment key structures.

Figure 13B:
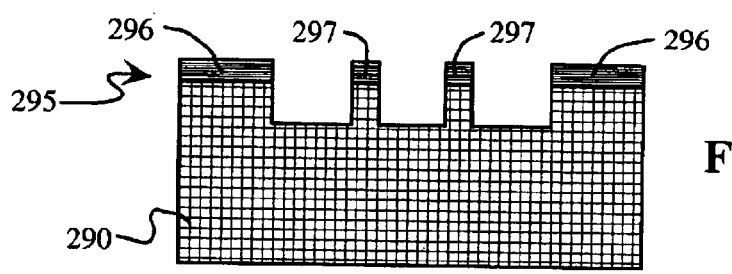

FIG. 13B depicts the DRIE process for forming the primary cavity 293 and the secondary alignment key structures 294. The DRIE process removes the unmasked regions of the silicon wafer 290 and the material under the mask layer 295 is left in place. The DRIE process may be performed in a commercially available system such as the Unaxis DRIE system from Unaxis of St. Petersburg, Fl. The Unaxis system uses an etching process known in the art as the Bosch process. An advantage of the Bosch process is that it provides the ability to generate structures with preferred nearly vertical sidewall profiles.

Figure 13C:
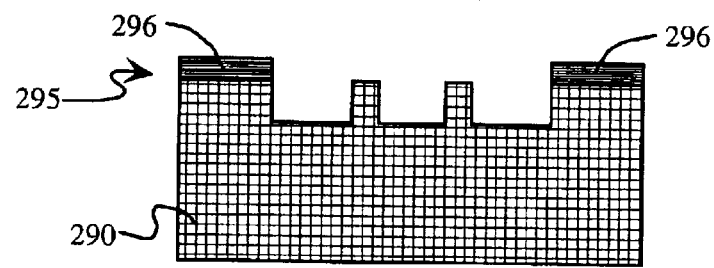

FIG. 13C shows a second patterning step that also uses photoresist materials. The masking layer 295 is removed and then reapplied so that only the outer portion 296 is present. Hence, the material of the silicon wafer 290 corresponding to the secondary alignment key structures 294 is left uncovered. This pattern of the mask layer 295 is then used for translating the secondary alignment key structures 294 to the bottom of the primary cavity 293.

Figure 13D:
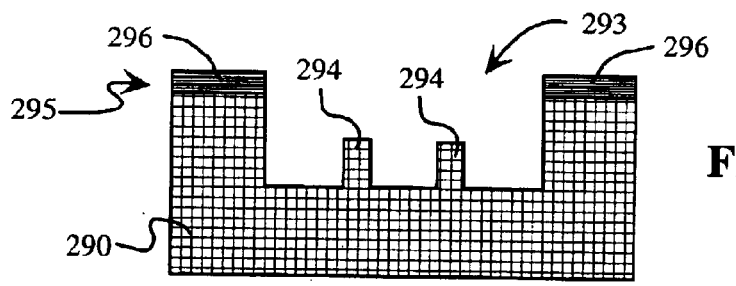
Figure 13E:
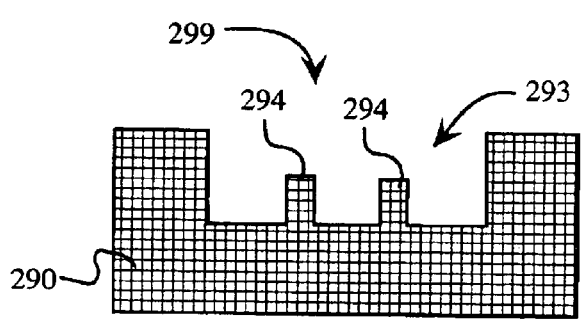

FIG. 13D depicts the second application of the DRIE process for translating the secondary alignment structures 294 to the bottom of the primary cavity 293. FIG. 13E shows the resulting receptacle 299 after the mask layer 295 is removed. As can be seen from FIG. 13E, the double etch process provides for creating a three-dimensional receptacle 299 with secondary alignment key structures 294 having heights that are less than the depth of the primary cavity 293. FIG. 13E shows a primary cavity 293 with two alignment key structures 294. Other receptacle shapes according to embodiments of the present invention are described in the copending and commonly assigned patent application entitled "Oriented Self-Location of Microstructures with Alignment Structures," Ser. No. 60/490,193.

The next major step in the printing method of the present invention comprises populating the assembly template with the individual semiconductor structures. Preferably, fluidic self-assembly methods are used to populate the assembly template with the individual semiconductor structures. As discussed above, there are basically two approaches for fluidic self-assembly known in the art, which differ in the underlying mechanism used to locate, position, and connect the components into the larger system. The first approach utilizes chemically based driving forces to govern the assembly process (i.e., attraction, positioning, orientation, and ordering are controlled by molecular interactions at the surfaces of the objects). Embodiments of this first approach are described by Karl F. Bohringer et al., in "Modeling of Capillary Forces and Bind Sites for Fluidic Self-Assembly," *MEMS 2001: The 14th IEEE International Conference on Micro Electro Mechanical Systems*, 2001, pages 369–374. The second approach uses gravitational forces and geometrical constraints (i.e., shaped components and complementarily shaped receptacle sites). The method discussed below for populating the assembly template use geometrically patterned semiconductor structures and, therefore, employ the second approach. However, those skilled in the art will appreciate that the assembly template of the present invention may be populated by methods that employ the first approach.

Figure 5A:
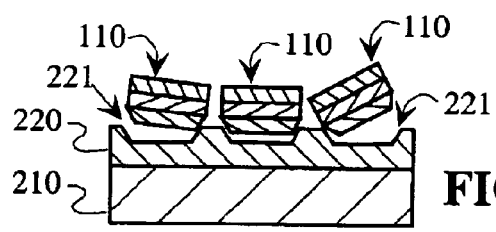
FIGS. 5A–5B illustrate the steps for the fluidic self-location of geometrically shaped device or integrated circuit components onto an assembly template in accordance with a preferred embodiment of the present invention.
Figure 5B:
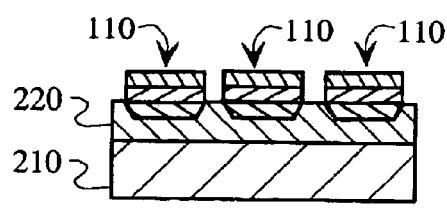

FIGS. 5A–5B schematically illustrate the preferred steps for populating the assembly template 200 with the individual semiconductor structures 110. In a preferred embodiment, the individual semiconductor structures 110 are delivered to the assembly template 200 using a fluidic self-assembly process (FSA) process. As shown in FIG. 5A, an ethanol slurry may be used to flow the individual geometrically patterned semiconductor structures 110 over the polymer layer 220 with the shaped receptacles 221. The individual semiconductor structures 10 access the complementary-shaped receptacles 221 in the assembly template 200. A multiple step assembly sequence may be used where different types of individual semiconductor structures 110 with different shapes and sizes are to be applied to the assembly template, where the larger structures 110 are applied to the assembly template 200 before the smaller structures are applied.

As noted above, alternative methods may be used to prepare an assembly template and apply individual semiconductor structures to the assembly template. Specifically, shaped receptacles may be created directly in a silicon wafer, as described in U.S. Pat. No. 5,545,291. Alternatively, selective coatings or electrostatic attractive forces may be used to position individual semiconductor structures on an assembly template. A method for self-assembly using selective coatings is described in the commonly-owned U.S. patent application Ser. No. 10/218,053.

The final major step in the printing method of the present invention comprises applying or "printing" the individual semiconductor structures that have been positioned on specific locations on the assembly template to a host substrate containing host circuits. The host circuits may comprise CMOS circuits, or InP-based, GaAs-based, or Nitride-based millimeter monolithic integrated circuits (MMICs), or other semiconductor circuits well-known in the art. This printing step allows individual semiconductor structures of varying complexity to be integrated with host circuitry contained on a single wafer to obtain an electronic system on a wafer. Thus, wafer-level integration is achieved, but the resulting electronic system may provide a high level of functionality in a relatively small size, due to the large numbers of different individual semiconductor structures that may be coupled to the circuitry on the host substrate.

Figure 6A:
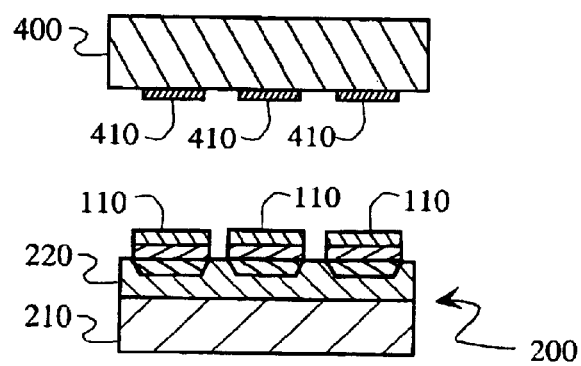
FIGS. 6A–6C schematically illustrates the steps for the transfer and integration of device and integrated circuit components onto a host circuit.
Figure 6B:
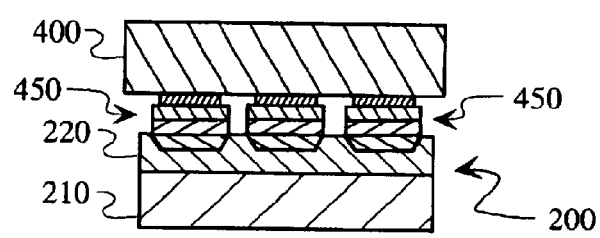
Figure 6C:
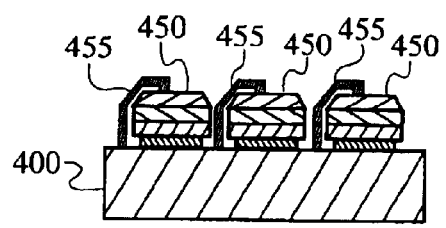

FIGS. 6A–6C illustrate one embodiment of the steps for applying or "printing" the individual semiconductor structures 10 on a host substrate 400 containing host circuits 410. In FIG. 6A, the assembly template 200 containing the individual semiconductor structures 110 is aligned with the host substrate 400 containing the host circuits. Precise alignment of the arrays of structures 10 in the assembly template 200 with the host circuits 410 may be provided by wafer-to-wafer alignment systems discussed above. Such systems can provide precise sub-micron positioning. Preferably, the alignment of the assembly template 200 with the host substrate 400 is facilitated by backside and front alignment marks side as discussed above.

FIG. 6B shows the bonding of the individual semiconductor structures 10 with the host circuits 410 to create integrated structures 450. The bonding of the structures 110 with the host circuits 410 may be achieved by using surface-mounting techniques known in the art, such as direct surface bonding, plasma-activated surface bonding, plasma-assisted surface bonding, gold compression bonding, eutectic bonding or other adhesive techniques. After bonding, the individual semiconductor structure portions of the integrated structures 450 are released from the assembly template 200 and the assembly template 200 is removed. The structures 450 are generally released by simply separating the assembly template 200 from the host substrate 400, since the mechanical forces bonding the individual semiconductor structures 110 to the host circuits 410 generally exceed the mechanical forces causing the individual semiconductor structures 10 to adhere to the assembly template 200.

After the assembly template is removed, electrical interconnects 455 may be formed between circuits on the host substrate 400 and the integrated structures 450 as shown in FIG. 6C. Techniques for forming robust electrical interconnections known in the art, such as conventional photolithography and metallization techniques, may be used.

FIGS. 6A–6C show the bonding of the individual semiconductor structures 10 without any additional preparation of the host substrate 400. However, additional preparation and processing of the host substrate wafer may be performed prior to bonding to facilitate bonding the individual semiconductor structures to the host substrate. FIGS. 7A–7D illustrate an alternative method according to the present invention for printing individual semiconductor structures on a host substrate after the host substrate has been additionally processed to receive the individual semiconductor structures.

Figure 7A:
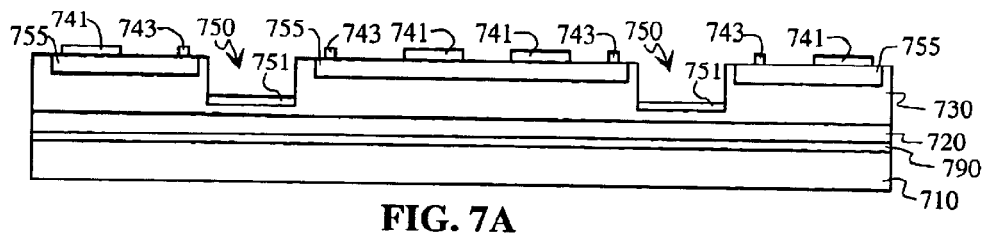
FIGS. 7A–7D illustrate the steps for preparing a host substrate for receipt of individual semiconductor structures and transfer of the individual semiconductor structures to the host substrate.

FIG. 7A shows a host substrate wafer 700 with a substrate layer 710 and one or more semiconductor layers 720, 730. Host circuits 755, such as CMOS circuits, or InP-based, GaAs-based, or Nitride-based MMICs, are formed within at least one semiconductor layer 730 of the wafer 700. The wafer 700 may further comprise an etch stop layer 790. Bond pads 741 are provided on top of the wafer to allow electrical connections to the host circuits 755. Inter integrated-circuit pads 743 may be provided to allow electrical connections to the individual semiconductor structures 10 to be assembled on the host substrate wafer 700. During the processing of the wafer 700 to form the host circuits, protective window regions 750 within the wafer are provided to define the locations of the individual semiconductor structures 10 to be applied to the wafer. These regions 750 are left clear of circuitry. Window layers 751, typically consisting of dielectric/metal over-layers, are provided at the protective window regions 750 to prevent the roughening or contamination of the substrate surface during semiconductor fabrication processing. The wafer 700 may be fabricated in a standard semiconductor foundry using standard processes.

Figure 7B:
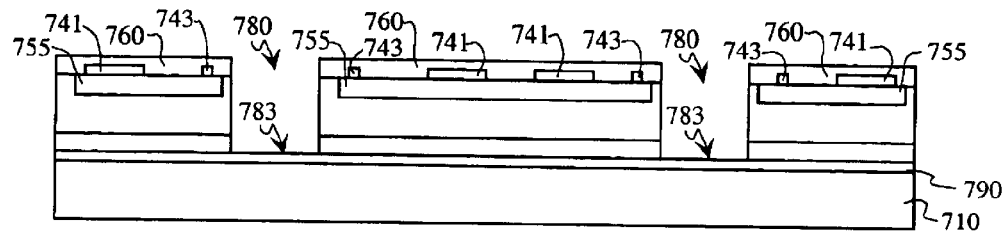

FIG. 7B illustrates the removal of the window layers 751 and the additional processing of the host substrate wafer 700 to receive the individual semiconductor structures 110. A circuit protection layer 760 is applied over the host circuits 755 and the associated pads 741, 743. The window layers are removed using standard etching procedures. Wells 780 to accommodate the individual semiconductor structures 110 are then etched into the host substrate wafer 700 using etching techniques such as $SF_6$-based deep reactive ion etching (typically used for high aspect ratio etching for the fabrication of micro electro-mechanical system devices). If the host substrate wafer 700 comprises a Silicon-on- Insulator wafer, the process of forming the wells 780 is simplified, since a Silicon-on-Insulator structure provides a very flat etch stop layer 790 at an appropriate and uniform distance from the surface of the host substrate wafer 700. Areas at the bottom of the wells 780 provide bonding surface regions 783 adapted to receive the individual semiconductor structures 110.

The generation of a common mask set for both the host substrate wafer 700 and the assembly template 200 is preferred, since the common mask set will help ensure proper registration and alignment of the host substrate wafer 700 and the individual semiconductor structures 110 within the assembly template 200. In addition to the host circuits 755, the host substrate wafer 700 preferably comprises additional alignment marks (not shown in FIGS. 7A–7D) to allow precise positioning of the host substrate wafer 700 with respect to the assembly template 200 during the bonding step described below.

Figure 7C:
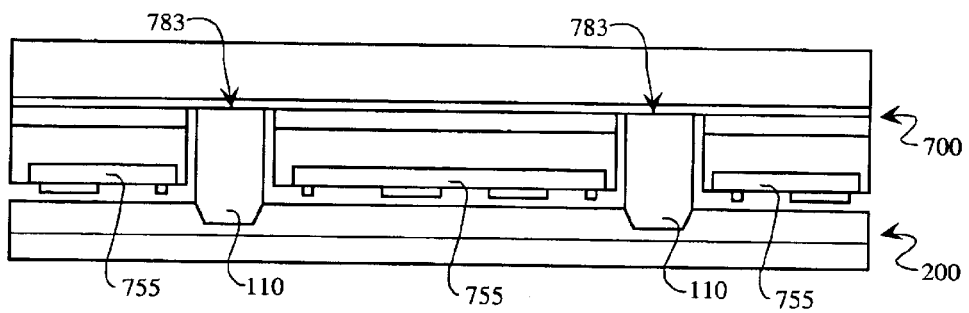

FIG. 7C illustrates aligning the host substrate wafer 700 to the assembly template 200 and bonding the individual semiconductor structures 110 to the host substrate wafer 700. As shown in FIG. 7C, the individual semiconductor structures 110 are positioned within the wells 780 and bonded at the bonding surface regions 783. Preferably, backside alignment marks (not shown) on the assembly template 200 are used to accurately position the individual semiconductor structures 110 in relation to the host substrate wafer 700 during the bonding procedure. Permanent bonding of the individual semiconductor structures 110 at the bonding surface regions may be accomplished by several approaches. One approach that works well to bond III–V semiconductor surfaces to an oxide surface, is direct bonding of an oxidized surface of an individual semiconductor structure 10 to $SiO_2$ that is present at the bonding surface regions 783. Oxidation of a surface of an individual semiconductor structure 110 may be performed through an oxygen plasma treatment. Adjusting pressure and temperature cycles can optimize the strengths of bonds provided by this approach. Alternatively, a metal-to-metal compression bonding approach may be used to bond the individual semiconductor structures 110 to the host substrate wafer 700. This approach allows the incorporation of a ground plane under the individual semiconductor structure 110.

Figure 7D:
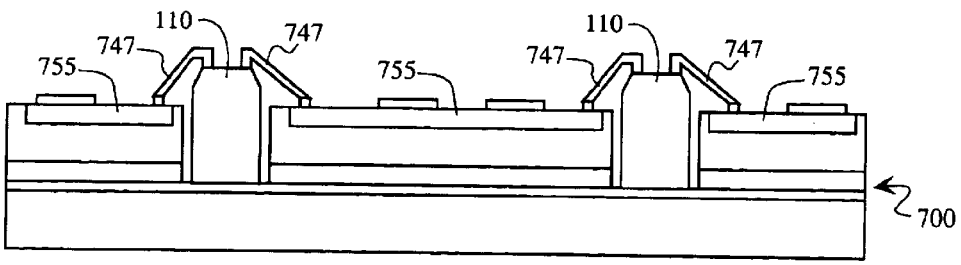

FIG. 7D illustrates a resulting integrated system after the individual semiconductor structures 10 have been bonded to the host substrate wafer 700 and the assembly template 200 has been removed. The structures 10 may be released by simply separating the assembly template 200 from the host substrate wafer 700, if the mechanical forces bonding the individual semiconductor structures 110 to the host substrate wafer 700 exceed the mechanical forces causing the individual semiconductor structures 10 to adhere to the assembly template 200. In this step, electrical interconnects 747 to the individual semiconductor structures 10 may be fabricated using techniques known in the art. Other processing steps may also be performed in this step, such as delineating the host substrate wafer 700 into several subwafers.

The printing method described above provides for nearly full utilization of the host circuit substrate by using the bonded individual semiconductor structures to provide functions that can not be efficiently fabricated on the host substrate. The method also allows for nearly full utilization of the substrates used to provide the individual semiconductor structures, since the fabricated structures are delineated into individual elements without requiring interconnections between the elements. Due to the excellent alignment accuracy provided by commercially available alignment fixtures, almost any configuration of arrays of individual semiconductor structures can be integrated with host circuits. The method may accommodate the integration of large numbers of individual semiconductor structures with host circuits, and may also accommodate the integration of smaller numbers of structures at the wafer scale or die level if necessary.

From the foregoing description, it will be apparent that the present invention has a number of advantages, some of which have been described above, and others of which are inherent in the embodiments of the invention described above. Also, it will be understood that modifications can be made to the method described above without departing from the teachings of subject matter described herein. As such, the invention is not to be limited to the described embodiments except as required by the appended claims.

What is claimed is:

1. A method for fabricating an integrated electronic system comprising the steps of:
   (a) providing a plurality of individual semiconductor structures fabricated for capture by an assembly template;
   (b) forming the assembly template for capture of particular ones of the individual semiconductor structures;
   (c) populating the assembly template with the particular ones of the individual semiconductor structures to form a populated assembly template with the particular ones of the individual semiconductor structures on the populated assembly template; and
   (d) bonding at least one of the individual semiconductor structures on the populated assembly template with a host substrate comprising one or more host circuits.

2. The method of claim 1 wherein at least one of the individual semiconductor structures is formed by a masking and etching process.

3. The method of claim 1 wherein the assembly template is formed with receptacles and the individual semiconductor structures and the receptacles are formed to be complementary to each other.

4. The method of claim 3 wherein step (c) is performed through the use of a fluid transport medium.

5. The method of claim 1 wherein step (d) further comprises the step of aligning the populated assembly template to the host substrate before bonding the at least one individual semiconductor structure to the host substrate.

6. The method of claim 5, wherein the assembly template and the host substrate have alignment marks and the step of aligning comprises aligning the alignment marks.

7. The method of claim 1 wherein the step of bonding comprises direct surface bonding, plasma-assisted bonding, plasma-activated bonding, eutectic bonding or gold compression bonding.

8. The method of claim 1, wherein the host substrate comprises a material from the group consisting of GaAs, InP, SiC, $Al_2O_3$, Si, SiGe, GaSb, InSb, CdTe, CdZnTe, and InAs.

9. The method of claim 1, wherein the individual semiconductor structures may comprise one or more structures from the group consisting of capacitors, inductors, diodes, transistors, and integrated circuit modules.

10. The method of claim 1, wherein step (a) comprises the steps of:
   (a1) growing one or more device layers on a growth substrate wafer;
   (a2) delineating the one or more device layers to provide one or more delineated elements;
   (a3) applying a filler layer over the one or more delineated elements;

(a4) removing some or all of the growth substrate wafer;

(a5) patterning the one or more delineated elements to provide one or more individual semiconductor structures of the plurality of individual semiconductor structures; and (a6) removing the filler layer to release the one or more individual semiconductor structures.

11. The method of claim 10, wherein step (a3) includes a step of applying a handle wafer and step (a6) includes a step of removing the handle wafer.

12. The method of claim 1, wherein step (a) comprises the steps of:

(a1) growing one or more device layers on a growth substrate wafer;

(a2) processing the one or more device layers to provide one or more individually delineated and geometrically shaped semiconductor structures;

(a3) applying a filler layer over the plurality of individually delineated and geometrically shaped semiconductor structures;

(a4) removing some or all of the growth substrate wafer to provide one or more individual semiconductor structures of the plurality of individual semiconductor structures; and (a5) removing the filler layer to release the one or more individual semiconductor structures.

13. The method of claim 12, wherein step (a3) includes a step of applying a handle wafer and step (a5) includes a step of removing the handle wafer.

14. The method of claim 1, wherein step (a) comprises the steps of:

(a1) growing one or more device layers on a growth substrate wafer;

(a2) applying a polymer layer on top of the one or more device layers;

(a3) forming geometric shapes in the polymer layer;

(a4) delineating the one or more device layers under the geometric shapes to provide one or more delineated and patterned semiconductor structures;

(a5) applying a filler layer over the one or more delineated and patterned semiconductor structures (a6) removing some or all of the growth substrate wafer to provide one or more individual semiconductor structures of the plurality of individual semiconductor structures; and (a7) removing the filler layer to release the one or more individual semiconductor structures.

15. The method of claim 14, wherein step (a5) includes a step of applying a handle wafer and step (a7) includes a step of removing the handle wafer.

16. The method of claim 1, where step (a) comprises the steps of:

(a1) growing one or more device layers on a growth substrate wafer;

(a2) applying a polymer layer on top of the one or more device layers;

(a3) forming geometric shapes in the polymer layer;

(a5) applying a filler layer over the geometric shapes in the polymer layer;

(a6) delineating the one or more device layers to provide the one or more individual semiconductor structures; and (a7) removing the filler layer to release the one or more individual semiconductor structures.

17. The method of claim 1, wherein the geometric shapes are alignment structures comprising one or more layers of polymer material.

18. The method of claim 16, wherein step (a5) includes a step of applying a handle wafer and step (a7) includes a step of removing the handle wafer.

19. The method of claim 1, wherein step (b) comprises the steps of:

(b1) applying a polymer layer to an assembly substrate wafer; and (b2) stamping the polymer layer with a stamp wafer to form receptacles in the polymer layer to provide the assembly template.

20. The method of claim 1, wherein step (b) comprises the steps of:

(b1) providing a silicon wafer;

(b2) masking the silicon wafer; and (b3) removing the unmasked portions of the silicon wafer to form receptacles in the silicon wafer to provide the assembly template.

21. The method of claim 20, wherein steps (b2) and (b3) are performed multiple times to provide one or more receptacles having a primary cavity and one or more secondary alignment key structures, the one or more secondary alignment key structures having heights that are less than a depth of the primary cavity.

22. The method of claim 1, wherein step (d) comprises the steps of:

(d1) positioning the host substrate above the populated assembly template (d2) aligning the host substrate with the populated assembly template;

(d3) bringing the host substrate into contact with at least one of the individual semiconductor structures on the populated assembly template;

(d4) bonding at least one of the individual semiconductor structures on the populated assembly template to the host substrate using a surface-mounting process; and (d5) releasing the bonded individual semiconductor structures from the populated assembly template.

23. The method of claim 1, wherein the host substrate is fabricated to provide one or more wells, each well of the one or more wells fabricated to receive one of the plurality of individual semiconductor structures.

24. The method of claim 23, the method further comprising the steps of:

providing the host substrate with the one or more host circuits and with one or more window regions, said window regions having window layers over said window regions;

applying a circuit protection layer over said one or more host circuits;

removing said window layers; and etching said host substrate at said window regions to provide said wells.

25. An integrated electronic system made by the method of claim 1, wherein at least one of the one or more host circuits comprises a CMOS circuit, an InP-based MMIC, a GaAs-based MMIC, or a Nitride-based MMIC.

26. A method for fabricating an integrated electronic system comprising the steps of:

(a) providing a plurality of semiconductor structures of one or more types, each type of semiconductor structure being fabricated with a corresponding geometric shape;

(b) forming an assembly template, the assembly template having an array of receptacles, each receptacle having a shape complementary to the geometric shape of one type of semiconductor structure;

(c) positioning at least one semiconductor structure of the plurality of semiconductor structures in at least one receptacle of the assembly template, each semiconductor structure being positioned in a receptacle having a shape complementary to the geometric shape of the semiconductor structure; and (d) bonding at least one of the semiconductor structures in a receptacle of the assembly template to a host substrate having one or more host circuits.

27. The method of claim 26, wherein step (a) comprises the steps of:

(a1) growing one or more device layers on a growth substrate wafer;

(a2) delineating the one or more device layers to provide one or more delineated elements;

(a3) applying a filler layer over the one or more delineated elements;

(a4) removing at least a portion of the growth substrate wafer;

(a5) patterning the one or more delineated elements to provide one or more semiconductor structures of the plurality of semiconductor structures; and (a6) removing the filler layer to release the one or more semiconductor structures.

28. The method of claim 26, wherein step (a) comprises the steps of:

(a1) growing one or more device layers on a growth substrate wafer;

(a2) processing the one or more device layers to provide one or more individually delineated and geometrically shaped semiconductor structures;

(a3) applying a filler layer over the plurality of individually delineated and geometrically shaped semiconductor structures;

(a4) removing at least a portion of the growth substrate wafer to provide one or more semiconductor structures of the plurality of semiconductor structures; and (a5) removing the filler layer to release the one or more semiconductor structures.

29. The method of claim 26, wherein step (a) comprises the steps of:

(a1) growing one or more device layers on a growth substrate wafer;

(a2) applying a polymer layer on top of the one or more device layers;

(a3) forming geometric shapes in the polymer layer;

(a4) delineating the one or more device layers under the geometric shapes to provide one or more delineated and patterned semiconductor structures;

(a5) applying a filler layer over the one or more delineated and patterned semiconductor structures (a6) removing at least a portion of the growth substrate wafer to provide one or more semiconductor structures of the plurality of semiconductor structures; and (a7) removing the filler layer to release the one or more semiconductor structures.

30. The method of claim 26, wherein step (a) comprises the steps of:

(a1) growing one or more device layers on a growth substrate wafer;

(a2) applying a polymer layer on top of the one or more device layers;

(a3) forming geometric shapes in the polymer layer;

(a5) applying a filler layer over the geometric shapes in the polymer layer;

(a6) delineating the one or more device layers to provide one or more semiconductor structures; and (a7) removing the filler layer to release the one or more semiconductor structures.

31. The method of claim 26, wherein step (b) comprises the steps of:

(b1) providing an assembly template wafer;

(b2) applying a polymer layer to the assembly template wafer;

(b3) fabricating a stamp pattern wafer, the stamp pattern wafer having one or more patterns with generally the same shapes as the geometric shapes of the semiconductor structures; and (b4) applying the stamp pattern wafer to the polymer layer to provide the array of receptacles.

32. The method of claim 26, wherein step (b) comprises the steps of:

(b1) providing a silicon wafer;

(b2) masking the silicon wafer; and (b3) removing the unmasked portions of the silicon wafer to form the array of
receptacles in the silicon wafer to provide the assembly template, wherein steps (b2) and (b3) are performed multiple times to provide one or more receptacles having a primary cavity and one or more secondary alignment key structures, the one or more secondary alignment key structures having heights that are less than a depth of the primary cavity.

33. The method of claim 26, wherein step (c) comprises the steps of:

(c1) mixing the semiconductor structures with an assembly fluid to form a slurry;

(c2) depositing the slurry on the assembly template to cause each semiconductor structure to self-align in the complementary-shaped receptacle; and (c3) removing the assembly fluid.

34. The method of claim 26, wherein step (d) comprises the steps of:

(d1) positioning the host substrate above the assembly template (d2) aligning the host substrate with the assembly template;

(d3) bringing the host substrate into contact with at least one of the individual semiconductor structures;

(d4) bonding at least one of the individual semiconductor structures to the host substrate using a surface-mounting process; and (d5) releasing the bonded individual semiconductor structures from the assembly template.

35. The method of claim 26, wherein the host substrate is fabricated to provide one or more wells, each well of the one or more wells fabricated to receive one of the plurality of individual semiconductor structures.

36. The method of claim 35, the method further comprising the steps of:

providing the host substrate with the one or more host circuits and with one or more window regions, said window regions having window layers over said window regions;

applying a circuit protection layer over said one or more host circuits;

removing said window layers; and etching said host substrate at said window regions to provide said wells.

37. The method of claim 26 wherein step (d) further comprises the step of aligning the assembly template to the host substrate before bonding the at least one individual semiconductor structure to the host substrate.

38. The method of claim 37, wherein the assembly template and the host substrate have alignment marks and the step of aligning comprises aligning the alignment marks.

39. The method of claim 26 wherein the step of bonding comprises direct surface bonding, plasma-assisted bonding, plasma-activated bonding, eutectic bonding or gold compression bonding.

40. The method of claim 26, wherein the host substrate comprises a material from the group consisting of GaAs, InP, SiC, $Al_2O_3$, Si, SiGe, GaSb, InSb, CdTe, CdZnTe, and InAs.

41. The method of claim 26, wherein the types of semiconductor structures may comprise one or more structures from the group consisting of capacitors, inductors, diodes, transistors, and integrated circuit modules.

42. An integrated electronic system made by the method of claim 26, wherein at least one of the one or more host circuits comprises a CMOS circuit, an InP-based MMIC, a GaAs-based MMIC, or a Nitride-based MMIC.

* * * * *